(12) United States Patent
Lung

(10) Patent No.: US 8,237,148 B2
(45) Date of Patent: Aug. 7, 2012

(54) 4F² SELF ALIGN SIDE WALL ACTIVE PHASE CHANGE MEMORY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 311 days.

(21) Appl. No.: 12/792,604

(22) Filed: Jun. 2, 2010

(65) Prior Publication Data

US 2010/0237316 A1   Sep. 23, 2010

Related U.S. Application Data

(63) Continuation of application No. 11/736,440, filed on Apr. 17, 2007, now Pat. No. 7,755,076.

(51) Int. Cl.
*H01L 47/00* (2006.01)

(52) U.S. Cl. .............. 257/4; 438/95; 257/E45.002

(58) Field of Classification Search .......... 257/4, 5, 257/E45.002, E27.004; 438/95, 98, 102
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |

(Continued)

FOREIGN PATENT DOCUMENTS

WO 0079539 A1 12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — David Vu
(74) *Attorney, Agent, or Firm* — Haynes Beffel & Wolfeld LLP

(57) ABSTRACT

Arrays of memory cells are described along with devices thereof and method for manufacturing. Memory cells described herein include self-aligned side wall memory members comprising an active programmable resistive material. In preferred embodiments the area of the memory cell is 4F², F being the feature size for a lithographic process used to manufacture the memory cell, and more preferably F being equal to a minimum feature size. Arrays of memory cells described herein include memory cells arranged in a cross point array, the array having a plurality of word lines and source lines arranged in parallel in a first direction and having a plurality of bit lines arranged in parallel in a second direction perpendicular to the first direction.

8 Claims, 16 Drawing Sheets

U.S. PATENT DOCUMENTS

| | | | |
|---|---|---|---|
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,504 | B2 | 10/2004 | Li et al. |
| 6,800,563 | B2 | 10/2004 | Xu |
| 6,815,704 | B1 | 11/2004 | Chen |
| 6,830,952 | B2 | 12/2004 | Lung |
| 6,850,432 | B2 | 2/2005 | Lu et al. |
| 6,859,389 | B2 | 2/2005 | Idehara |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,903,362 | B2 | 6/2005 | Wyeth et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 7,023,009 | B2 | 4/2006 | Kostylev et al. |
| 7,033,856 | B2 | 4/2006 | Lung et al. |
| 7,042,001 | B2 | 5/2006 | Kim et al. |
| 7,067,865 | B2 | 6/2006 | Lung et al. |
| 7,132,675 | B2 | 11/2006 | Gilton |
| 7,166,533 | B2 | 1/2007 | Happ |
| 7,214,958 | B2 | 5/2007 | Happ |
| 7,220,983 | B2 | 5/2007 | Lung |
| 7,485,891 | B2 | 2/2009 | Hamann et al. |
| 2005/0029502 | A1 | 2/2005 | Hudgens |
| 2005/0093022 | A1 | 5/2005 | Lung |
| 2005/0127347 | A1 | 6/2005 | Choi et al. |
| 2005/0201182 | A1 | 9/2005 | Osada et al. |
| 2005/0212024 | A1 | 9/2005 | Happ |
| 2005/0215009 | A1 | 9/2005 | Cho |
| 2006/0108667 | A1 | 5/2006 | Lung |
| 2006/0110878 | A1 | 5/2006 | Lung et al. |
| 2006/0284157 | A1 | 12/2006 | Chen et al. |
| 2006/0284158 | A1 | 12/2006 | Lung et al. |
| 2006/0284214 | A1 | 12/2006 | Chen |
| 2006/0286709 | A1 | 12/2006 | Lung et al. |
| 2006/0286743 | A1 | 12/2006 | Lung et al. |
| 2007/0030721 | A1 | 2/2007 | Segal et al. |
| 2007/0045606 | A1 | 3/2007 | Magistretti et al. |
| 2007/0108077 | A1 | 5/2007 | Lung et al. |
| 2007/0108429 | A1 | 5/2007 | Lung |
| 2007/0108430 | A1 | 5/2007 | Lung |
| 2007/0108431 | A1 | 5/2007 | Chen et al. |
| 2007/0109836 | A1 | 5/2007 | Lung |
| 2007/0109843 | A1 | 5/2007 | Lung et al. |
| 2007/0111429 | A1 | 5/2007 | Lung |
| 2007/0115794 | A1 | 5/2007 | Lung |
| 2007/0117315 | A1 | 5/2007 | Lai et al. |
| 2007/0121363 | A1 | 5/2007 | Lung |
| 2007/0121374 | A1 | 5/2007 | Lung et al. |
| 2007/0126040 | A1 | 6/2007 | Lung |
| 2007/0131922 | A1 | 6/2007 | Lung |
| 2007/0131980 | A1 | 6/2007 | Lung |
| 2007/0138458 | A1 | 6/2007 | Lung |
| 2007/0147105 | A1 | 6/2007 | Lung et al. |
| 2007/0154847 | A1 | 7/2007 | Chen et al. |
| 2007/0155172 | A1 | 7/2007 | Lai et al. |
| 2007/0158632 | A1 | 7/2007 | Ho |
| 2007/0158633 | A1 | 7/2007 | Lai et al. |
| 2007/0158645 | A1 | 7/2007 | Lung |
| 2007/0158690 | A1 | 7/2007 | Ho et al. |
| 2007/0158862 | A1 | 7/2007 | Lung |
| 2007/0161186 | A1 | 7/2007 | Ho |
| 2007/0173019 | A1 | 7/2007 | Ho et al. |
| 2007/0173063 | A1 | 7/2007 | Lung |
| 2007/0176261 | A1 | 8/2007 | Lung |

FOREIGN PATENT DOCUMENTS

| | | | |
|---|---|---|---|
| WO | | 0145108 A1 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

4F² SELF ALIGN SIDE WALL ACTIVE PHASE CHANGE MEMORY

RELATED APPLICATIONS

This application is a continuation of co-pending U.S. patent application Ser. No. 11/736,440 filed on 17 Apr. 2007, which application is incorporated herein by reference.

PARTIES TO A JOINT RESEARCH AGREEMENT

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

A technology developed by the assignee of the present application is referred to as a phase change bridge cell, in which a very small patch of memory material is formed as a bridge across a thin film insulating member between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., which application was owned at the time of invention and is currently owned by the same assignee.

Another memory cell structure under development, referred to sometimes as a mushroom cell because of the shape of the active region on the bottom electrode in a typical structure, is based on the formation of a small electrode in contact with a larger portion of phase change material, and then a usually larger electrode in contact with an opposite surface of the phase change material. Current flow from the small contact to the larger contact is used for reading, setting and resetting the memory cell. The small electrode concentrates the current density at the contact point, so that an active region in the phase change material is confined to a small volume near the contact point. See, for example, Ahn et al., "Highly reliable 50 nm contact cell technology for 256 Mb PRAM," VLSI Technology 2005 Digest of Technical Papers, pages 98-99, 14 Jun. 2005; Denison, International publication No. WO2004/055916 A2, "Phase Change Memory and Method Therefore," Publication Date: 1 Jul. 2004; and Song et al., United States Patent Application Publication No. US 2005/0263829 A1, "Semiconductor Devices Having Phase Change Memory Cells, Electronic Systems Employing the Same and Methods of Fabricating the Same," Publication Date: 1 Dec. 2005.

Problems have arisen in manufacturing such devices with very small dimensions, and with variations in process that meet tight specifications needed for large-scale memory devices. It is desirable therefore to provide a memory cell structure with an array architecture supporting high-density devices, and a method for manufacturing such structure that meets tight process variation specifications needed for large-scale memory devices. It is further desirable to provide a manufacturing process and a structure which are compatible with manufacturing of peripheral circuits on the same integrated circuit. Furthermore, it is desirable to produce high density layouts for such cells.

SUMMARY OF THE INVENTION

An array of memory cells on a semiconductor substrate described herein includes a plurality of word lines on the semiconductor substrate extending in parallel in a first direction, the word lines having word line widths and respective sidewall surfaces. A sidewall dielectric layer on the sidewall surfaces. A plurality of pairs of doped regions in the substrate, wherein pairs between adjacent word lines include respective first and second doped regions. A plurality of memory members comprising a programmable resistive material with a transition region on the sidewall of dielectric layers, with first and second memory members in the plurality of memory members are placed between adjacent word lines having bottom surfaces in electrical contact with the respective first and second doped regions. A plurality of top electrode structures are positioned over and in electrical contact with memory members in the plurality of memory members, the top electrode structures having sides extending in parallel in a second direction perpendicular to the first direction, the memory members in the plurality of memory members having sides aligned with the sides of the corresponding top electrode structures. A plurality of dielectric isolation structures wherein the dielectric isolation structures isolate respective pairs of the first and second doped regions between adjacent word lines.

In some embodiments, the array of memory cells includes a plurality of bottom electrodes comprising electrode material, bottom electrodes in the plurality of bottom electrodes underlying corresponding memory members, first and second (left and right) bottom electrodes in the plurality of bottom electrodes between adjacent word lines having bottom surfaces in electrical contact with the respective first and second doped regions. Each memory member in the plurality of memory members functions like a self-heating element, functioning similarly to a fuse, in which the center area of each memory member generates the most amount of heat, while heat near edges of each memory member tend to dissipate. The center area is referred to as a transition region (for example, an amorphous region or phase change region) of each memory member that indicates the state or phase of a particular memory cell. The thickness of each memory member in the plurality of memory members can be substantially thin, typically ranging from about 2 nm to 50 nm and preferably about 20 nm.

In some embodiments, the memory cells have an area equal to $4F^2$, where the symbol F is about one half the sum of the word line width and the separation distance between word lines, typically about the minimum feature size for a lithographic process used in manufacturing the memory cells.

An integrated circuit memory device including memory cells implemented as described above is also described.

A method for manufacturing an array of memory cells on a semiconductor substrate as described herein comprises forming a plurality of word lines on the semiconductor substrate extending in parallel in a first direction, the word lines having word line widths and respective sidewall surfaces, forming a sidewall dielectric layer on the sidewall surfaces, forming a plurality of pairs of doped regions in the substrate, wherein pairs between adjacent word lines include respective first and second doped regions, forming a plurality of memory members comprising a programmable resistive material on the sidewall dielectric layers, with first and second memory members in the plurality of member members placed between adjacent word lines having bottom surfaces in electrical contact with the respective first and second doped regions, forming a plurality of top electrode structures positioned over and in electrical contact with memory members in the plurality of memory members, the top electrode structures having sides extending parallel in a second direction perpendicular to the first direction, and wherein the memory members in the plurality of memory members have sides aligned with the sides of the corresponding top electrode structures, and forming a plurality of dielectric isolation structures wherein the dielectric isolation structures isolate respective pairs of the first and second doped regions between adjacent word lines.

One embodiment of a method for manufacturing an array of memory cells includes forming a gate dielectric layer on the substrate, forming a first conductive layer on the gate dielectric layer, forming a second dielectric layer on the first conductive layer, patterning a plurality of strips of photoresist on the second dielectric layer, wherein adjacent strips are separated by a strip separation distance, the strips extending in parallel in a first direction, the strips having strip widths. The first conductive layer and the second dielectric layer are etched to expose portions of the gate dielectric layer not covered by the strips, thereby forming a plurality of word lines extending in parallel in the first direction, the word lines having respective sidewall surfaces. A plurality of first doped regions in the substrate are formed using the word lines as masks. A third dielectric layer is formed on the word lines and the exposed portions of the gate dielectric layer. The third dielectric layer is anisotropically etched to form a plurality of first word line structures where the encapsulated word line structures defining a plurality of trenches therebetween, wherein the encapsulated word line structures in the plurality of word line structures include (a) a word line from the plurality of word lines, (b) dielectric sidewall spacers on the sidewall surfaces of the word line, (c) a dielectric cap on the word line. A plurality of second doped regions are formed on or in the substrate within the trenches using the word line structures as masks. A programmable resistive layer is formed on the word line structures and in alternating trenches in the plurality of trenches. The programmable resistive layer and the second doped regions in the alternating trenches are etched, thereby forming a plurality of pairs of memory member structures from the programmable resistive layer and forming pairs of doped regions from the second doped regions, the pairs of doped regions include respective third and fourth doped regions between adjacent word line structures, the pairs of memory member structures include respective first and second memory member structures between adjacent word line structures having bottom surfaces in electrical contact with the respective third and fourth doped regions, the memory member structures having top surfaces. A layer of bit line material is formed on the top surfaces of the memory member structures. A plurality of bit lines and a plurality of memory members are formed by etching, thereby forming an array of memory cells, the memory members comprising a portion of one of the first or second memory member structures, the bit lines having sides extending in parallel in a second direction perpendicular to the first direction, the memory members having sides aligned with the sides of the corresponding bit line.

Other aspects and advantages of the invention are described below with reference to the figures.

DETAILED DESCRIPTION

Figure 1:
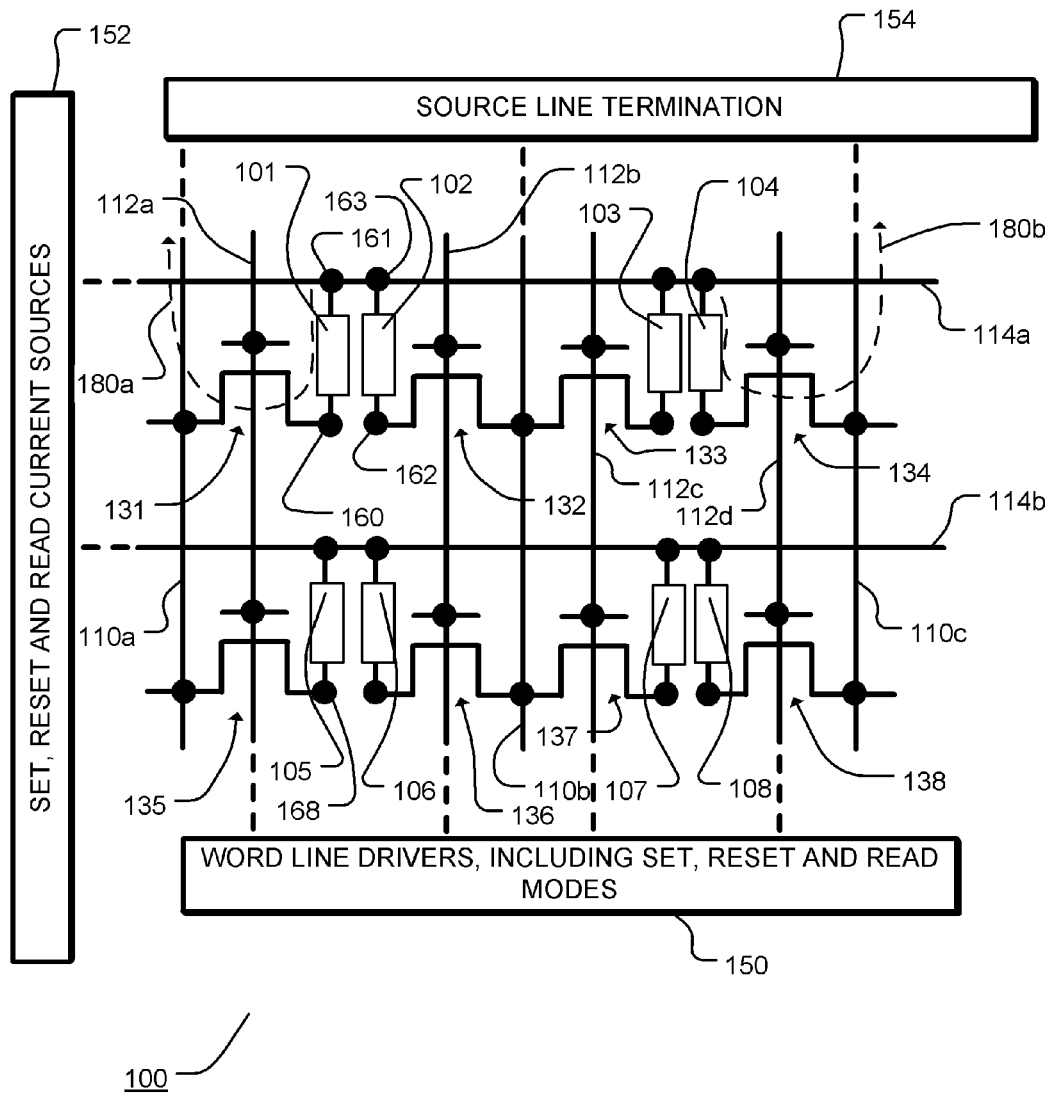
FIG. 1 is a schematic diagram of an array of memory cells comprising phase change memory members according to an embodiment.

The following description of the invention will typically be with reference to specific structural embodiments and methods. It is to be understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

A detailed description is provided with reference to FIGS. 1-25.

FIG. 1 is a schematic illustration of a memory array 100, which can be implemented using memory cells as described with reference to FIG. 3, or with other memory cells as described herein. Eight memory cells 131, 132, 133, 134, 135, 136, 137, and 138 having respective memory members 101, 102, 103, 104, 105, 106, 107, and 108 are illustrated in FIG. 1, representing a small section of an array that can include millions of memory cells.

In the schematic illustration of FIG. 1, common source lines 110a, 110b, and 110c, word lines 112a, 112b, 112c, and 112d are arranged generally parallel in the y-direction. Bit lines 114a, 114b are arranged generally parallel in the x-direction. Thus, a y-decoder and a word line driver 150, having set, reset, and read modes, are coupled to the word lines 112a, 112b, 112c, and 112d. Bit line current sources 152 for set, reset, and read modes, a decoder and sense amplifiers (not shown) are coupled to the bit lines 114a, 114b. The common source lines 110a, 110b, and 110c are coupled to the source line termination circuit 154, such as a ground terminal. The source line termination circuit 154 may include bias circuits such as voltage sources and current sources, and decoding circuits for applying bias arrangements, other than ground, to the source lines in some embodiments.

The common source line 110a is coupled to the source terminals of memory cells 131, 135. The common source line 110b is coupled to the source terminals of memory cells 132, 133, 136, 137. The common source line 110c is coupled to the source terminals of memory cells 134, 138. The word line 112a is coupled to the gate terminals of memory cells 131, 135. The word line 112b is coupled to the gate terminals of memory cells 132, 136. The word line 112c is coupled to the gate terminals of memory cells 133, 137. The word line 112d is coupled to the gate terminals of memory cells 134, 138.

Memory cells 131, 132 including respective memory members 101, 102 are representative. The drain of memory cell 131 is coupled to the bottom electrode 160 for memory member 101, which in turn is coupled to the top electrode 161. Likewise, the drain of memory cell 132 is coupled to the bottom electrode 162 for memory member 102, which in turn is coupled to the top electrode 163. The top electrodes 161, 163 are coupled to bit line 114a. Self-aligned memory cells 131, 132 have a dielectric isolation structure between the drain region of memory cell 131 and the drain region of memory cell 132 and between the bottom electrode 160 of memory cell 131 and the bottom electrode 162 of memory cell 132. The bottom electrodes of the memory cells are omitted in some embodiments.

In operation, current sources 152 and the word line drivers 150 operate in a lower current read mode, one or more intermediate current set modes, and a higher current reset mode. During the higher current reset mode, a current path 180a through the selected memory cell (e.g. memory cell 131 including memory member 101) is established by applying a current to the bit line 114a, and voltages on the word line 112a sufficient to turn on the access transistor of memory cell 131, so that the current flows through the source line 110a.

Likewise, during the lower current read mode, a current path 180b through the selected memory cell (see the memory cell 134 including memory member 104) is established by applying a current to the bit line 114a, and a voltage on the word line conductor 112d sufficient to turn on the access transistor of memory cell 134 and provide for current flow to the source line 110c.

During the set mode, used for one or more intermediate current levels, an access transistor is enabled, as just described with respect to the read mode.

Embodiments of the memory cell include phase change based memory materials, including chalcogenide based materials and other materials, for the memory members 101, 102, 103, 104, 105, 106, 107, 108. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

The following are short summaries describing four types of resistive memory materials.

1. Chalcogenide Material
   $Ge_xSb_yTe_z$
   x:y:z=2:2:5
   Or other compositions with x: 0~5; y: 0~5; z: 0~10
   GeSbTe with doping, such as N—, Si—, Ti—, or other element doping may also be used.
   Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.
   The post deposition annealing treatment with vacuum or N2 ambient is sometimes needed to improve the crystallize state of chalcogenide material. The annealing temperature typically ranges 100 C to 400 C with an anneal time of less than 30 minutes.
   The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material
   $Pr_xCa_yMnO_3$
   x:y=0.5:0.5
   Or other compositions with x: 0~1; y: 0~1
   Another CMR material that includes Mn oxide may be used
   Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.
   The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.
   The thickness of CMR material depends on the design of cell structure. The CMR thickness of 10 nm to 200 nm can be used to be the core material.
   A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound
   $Ni_xO_y$; $Ti_xO_y$; $Al_xO_y$; $W_xO_y$; $Zn_xO_y$; $Zr_xO_y$; $Cu_xO_y$; etc
   x:y=0.5:0.5
   Other compositions with x: 0~1; y: 0~1
   Formation method:
   1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.
   The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.
   2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.
   The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.
   3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

An exemplary method for forming chalcogenide material uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states. It is expected that some materials are suitable with even lower thicknesses.

Figure 2:
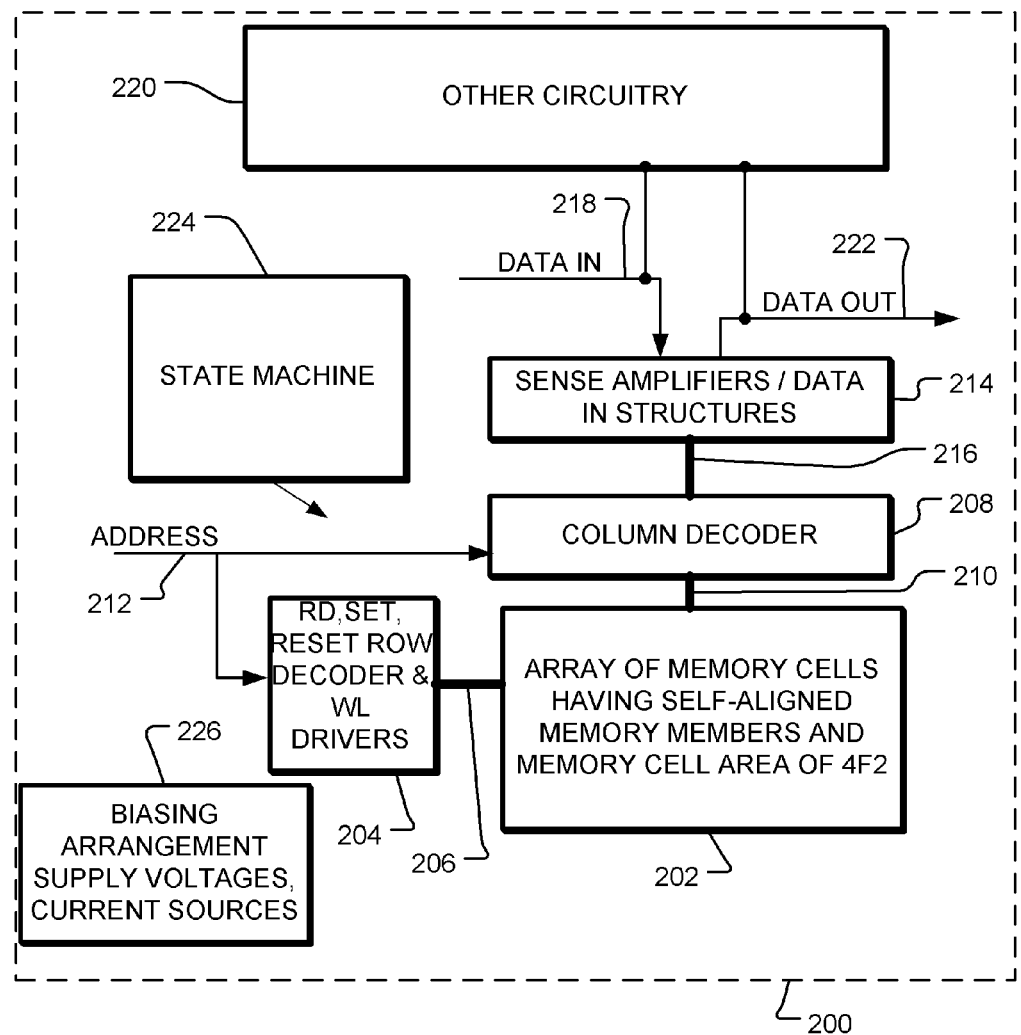
FIG. 2 is a block diagram of an integrated circuit device including a phase change memory array according to an embodiment.

FIG. 2 is a simplified block diagram of an integrated circuit in accordance with an embodiment. The integrated circuit 200 includes a memory array 202 implemented using memory cells as described herein having self aligned memory members and a memory cell area $4F^2$, on a semiconductor substrate. A row decoder 204 having read, set and reset modes is coupled to a plurality of word lines 206, and arranged along rows in the memory array 202. A column decoder 208 is coupled to a plurality of bit lines 210 arranged along columns in the memory array 202 for reading, setting and resetting memory cells in the memory array 202. Addresses are supplied on bus 212 to column decoder 208 and row decoder 204. Sense amplifiers and data-in structures in block 214, including current sources for the read, set and reset modes, are coupled to the column decoder 208 via data bus 216. Data is supplied via the data-in line 218 from input/output ports on the integrated circuit 200 or from other data sources internal or external to the integrated circuit 200, to the data-in structures in block 214. In the illustrated embodiment, other circuitry 220 is included on the integrated circuit 200, such as a general purpose processor or special purpose application circuitry, or a combination of modules providing system-on-a-chip functionality supported by the phase change memory cell array. Data is supplied via the data-out line 222 from the sense amplifiers in block 214 to input/output ports on the integrated circuit 200, or to other data destinations internal or external to the integrated circuit 200.

A controller implemented in this example using bias arrangement state machine 224 controls the application of bias arrangement supply voltages and current sources 226, such as read, set, reset and verify voltages and or currents for the word lines and bit lines, and controls the word line/source line operation using an access control process. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
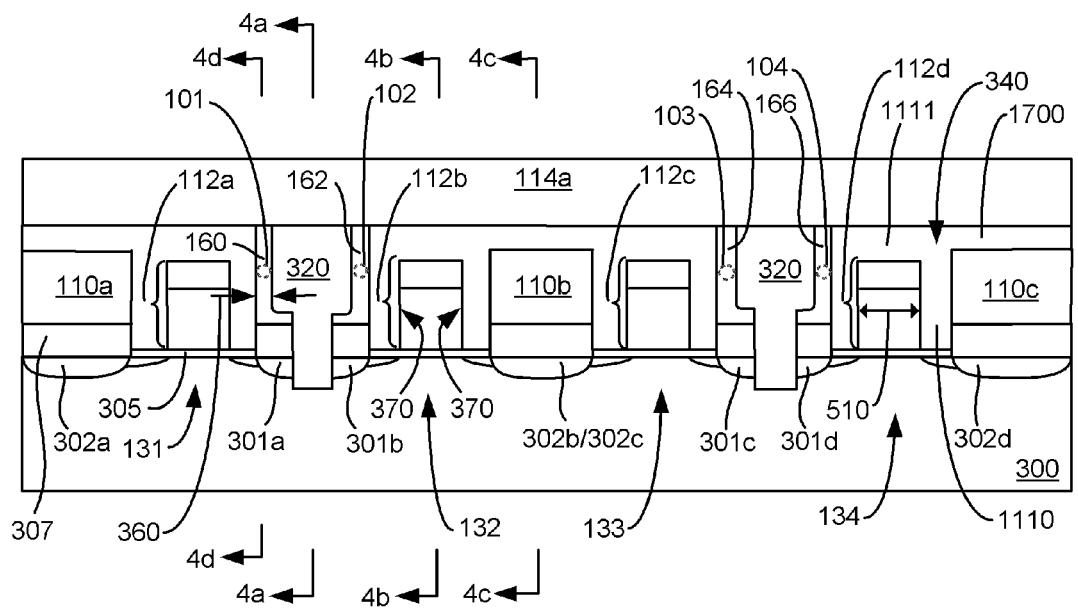
FIG. 3 illustrates an embodiment of an array of self-aligned memory cells.

FIGS. 3 and 4a-4d are cross-sectional views of a portion of a cross-point array of memory cells in accordance with an embodiment. FIG. 3 is a cross-section taken orthogonal to word lines 112, and includes memory cells 131, 132, 133, and 134 formed on a semiconductor substrate 300.

A gate dielectric layer 305 is on the substrate 300. Word lines 112 (including 112a, 112b, 112c, 112d) extend in parallel in a first direction into and out of the plane of the cross-section illustrated in FIG. 3, the word lines 112 on the gate dielectric layer 305. The word lines 112 have word line widths 510 and respective sidewall surfaces 370. In the illustrated embodiment, the word lines 112 comprise first and second conductor layers. In alternative embodiments the word lines comprise a single conductor layer. The word lines 112a, 112b, 112c, 112d form the respective gates of access transistors in memory cells 131, 132, 133, 134.

Dielectric structures 340 form a protective layer covering the word lines 112 and extending over conductive lines 110, the dielectric structures 340 isolating the word lines 112 from the memory members 160, 162, 164, 166 and conductive lines 110. Dielectric structures 340 comprise dielectric material and include cap portions 1111 over the word lines 112, sidewall spacers 1110 on the sidewall surfaces 370 of the word lines 360, and dielectric structures 1700 on the lines 110.

Memory cell 131 has the doped region 301a as the drain and doped region 302a as the source, memory cell 132 has the doped region 301b as the drain and doped region 302b/302c as the source, memory cell 133 has the doped region 301c as the drain and doped region 302b/302c as the source, memory cell 134 has the doped region 301d as the drain and doped region 302d as the source. As can be seen in FIG. 3, doped region 301a and doped region 301b form a pair of doped regions between adjacent word lines 112a and 112b. Additionally, doped region 301c and doped region 301d form a pair of doped regions between adjacent word lines 112c and 112d.

The doped regions 301, 302 can be implemented by self-aligned implant processes using the word lines 112 and sidewall spacers 1110 as masks. The self-alignment arises in the embodiment described herein by using the word lines 112 and sidewall spacers 1110 to define gaps therebetween, the gaps used to locate the doped regions 301, 302 as well as additional device elements created in and above the gaps, thus enabling the process to be a fully self-aligning process. Being a fully self-aligning process reduces the need for additional masks thereby simplifying manufacturing procedures. A fully self-aligning process also eliminates the need for alignment of the array and therefore increases the overall array density. The resulting array of memory cells is a contact electrode-free array, meaning it eliminates the need for additional lithographic steps to create additional contacts to the drain terminals of the access transistors. The elimination of the need for additional contacts helps to reduce the overall size of the memory cell.

In the illustrated embodiment of FIG. 3 portions of a bottom electrode layer comprising a conductive material 307 are in electrical contact with the doped regions 301, 302, the bottom electrode layer 307 in preferred embodiments comprises silicide. In some alternative embodiments the layer 307 is omitted.

Conductive lines 110 extending in the first direction overlie the source terminals 302 of the memory cells and are in electrical contact with the bottom electrode layer 307. In some alternative embodiments the lines 110 are omitted and the bottom electrode layer 307 on corresponding doped regions 302 are implemented as common source lines. In some alternative embodiments in which the lines 110 and conductive layer 307 are omitted, the doped regions 302 acting as source terminals are implemented as common source lines.

Dielectric isolation structures 320 extend into the substrate 300 to isolate pairs of doped regions between adjacent word lines (e.g. doped regions 301a, 301b between word lines 112a, 112b). Additionally, dielectric isolation structures 320 isolate pairs of memory elements between adjacent word lines (e.g. memory elements 160, 162 between word lines 112a, 112b). In the illustrated embodiment, the dielectric isolation structure comprises silicon dioxide.

The memory members 160, 162, 164, 166 of the respective memory cells 131, 132, 133, 134 are on the sidewall spacers 1110 and the memory members 160, 162, 164, 166 have bottom surfaces in electrical contact with respective drain regions 301.

Each of the memory members 160, 162, 164, 166 includes a respective transition region (for example, an amorphous region or phase change region) 101, 102, 103, 104 indicating the state or phase of a particular memory cell. The thickness 360 of each memory member in the memory members 160, 162, 164, 166 can be substantially thin. An average thickness of the each memory member is typically about 2 nm to 50 nm and preferably about 20 nm in some embodiments. The volume of memory material in transition regions 101, 102, 103, 104 can be very small, determined by the thickness 360 of the memory members 160, 162, 164, 166 and the width of the memory members 160, 162, 164, 166 (see FIG. 4d, ref num. 381). The thickness 360 of the memory members 160, 162, 164, 166 is determined in embodiments of the technology by thin film thicknesses, and is not limited by the minimum feature size F of lithographic processes used in manufacturing the memory cell. The thickness 360 of the memory members 160, 162, 164, 166 in preferred embodiments is substantially less than the word line width 510.

Conductive bit lines 114 have sides (see FIG. 4d, ref num. 380) extending in parallel in a second direction perpendicular to the first direction, the bit lines 114 forming the top electrodes for memory cells 131, 132, 133, and 134. In alternative embodiments, the bit lines 114 are positioned over a dielectric fill layer and in electrical contact through a conductive plug with the top electrodes for memory cells 131, 132, 133, and 134.

The memory members in the illustrated embodiment comprise memory material having at least two solid phases that are reversible, such as chalcogenide material or other related material, by applying a current though the memory member or applying a voltage across the bottom and top electrodes.

It will be understood that a wide variety of materials can be utilized in implementation of the conductive bit lines, conductive word lines, and conductive source lines, including metals such as aluminum, titanium nitride, and tungsten based materials as well as non-metal conductive material such as doped polysilicon. Suitable materials for implementing the bottom electrodes in the illustrated embodiment include TiN or TaN. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof.

Figure 4A:
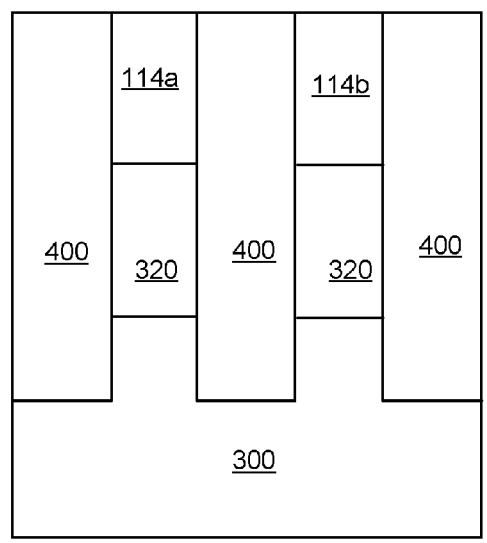
FIGS. 4a through 5 show additional details of a portion of the memory array of FIG. 3.
Figure 4B:
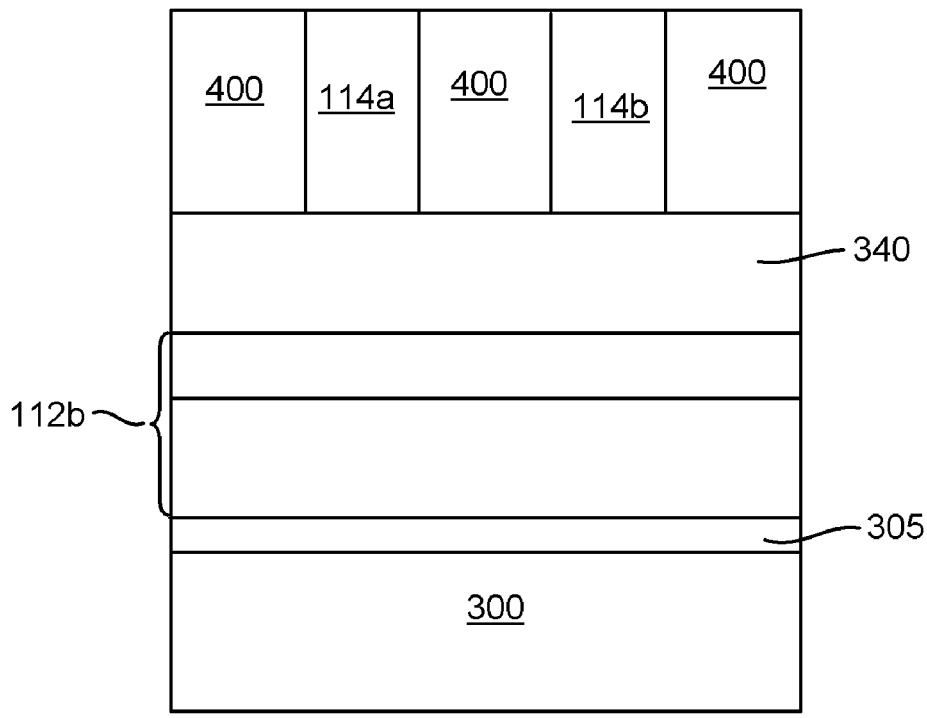
Figure 4C:
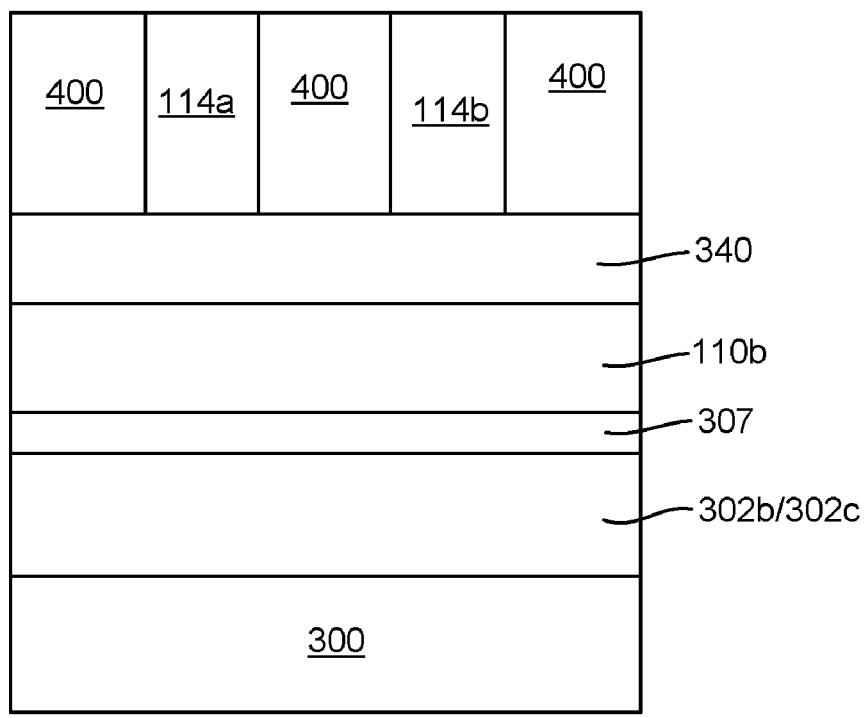
Figure 4D:
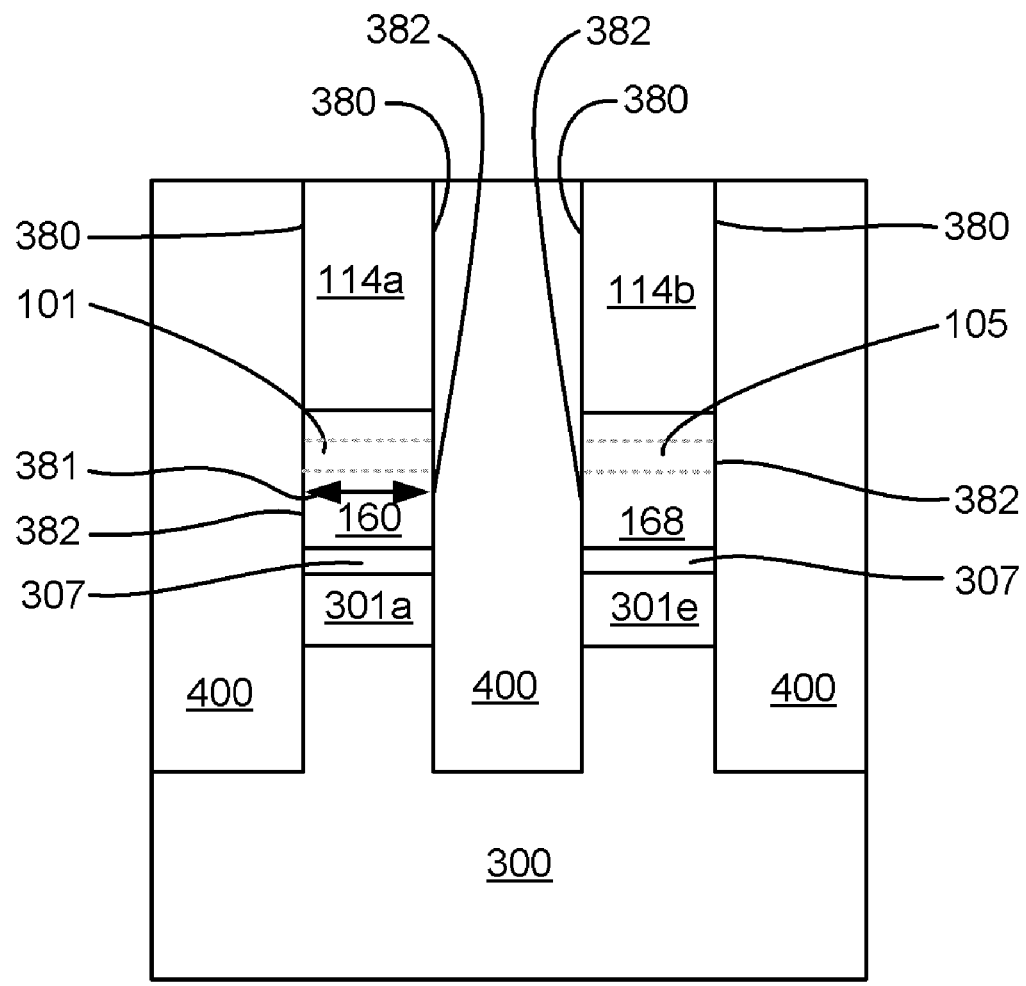

FIGS. 4a-4d illustrate cross-sections of the embodiment illustrated in FIG. 3 taken on the lines 4a-4a, 4b-4b, 4c-4c, and 4d-4d respectively and illustrate dielectric-filled trenches 400 extending in parallel in the second direction. The trenches 400 extend to the dielectric structures 340 and in regions of the array where the dielectric structures 340 are not present the trenches 400 extend into the substrate. FIG. 4a illustrates that the trenches 400 isolate bit lines 114 as well as the isolation structures 320 beneath respective bit lines 114. FIGS. 4b and 4c illustrate cross-sections of the word line 112b and the doped region 302b/302c respectively, illustrating that the trenches 400 extend to the dielectric structure 340. FIG. 4d illustrates that the trenches 400 isolate doped regions 301 beneath respective bit lines 114, as well as isolate memory members 160, 168, and isolate transition regions 101, 105. As can be seen in FIG. 4d, the memory members 160, 168 have sides 382 aligned with sides 380 of corresponding bit lines 114a, 114b.

Figure 5:
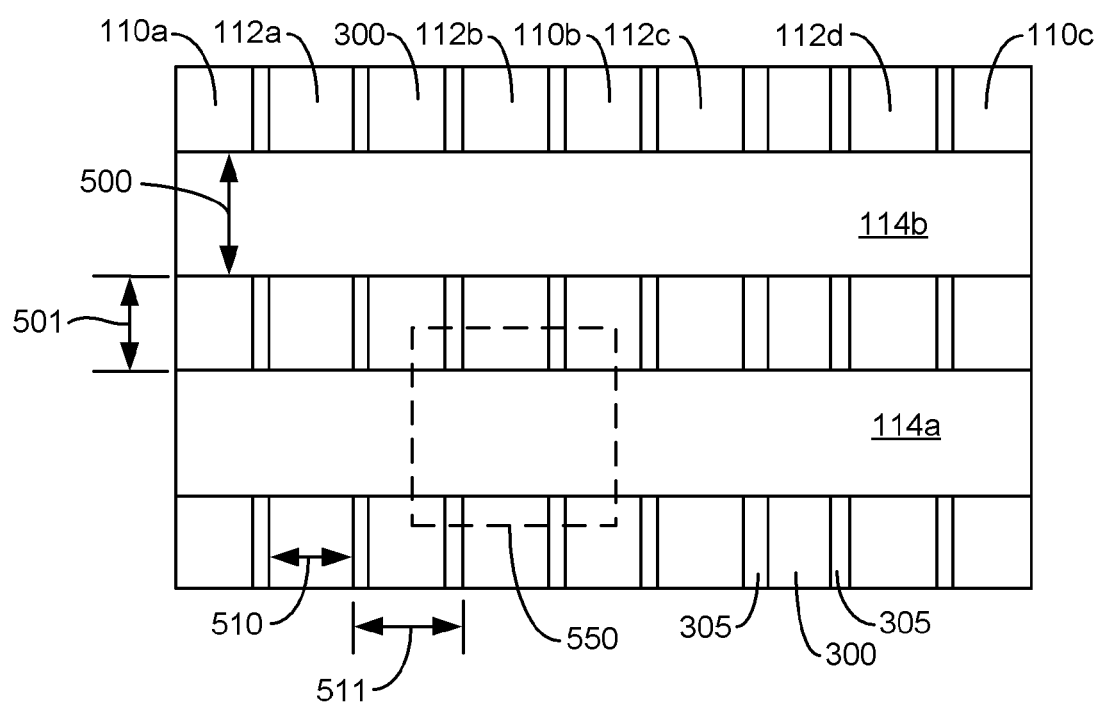

FIG. 5 illustrates a top, or plan, view of the embodiment illustrated in FIGS. 3 and 4a to 4c. The dielectric structures 340 and the dielectric material of trenches 400 are omitted from FIG. 5 for clarity. The bit lines 114 having bit line widths 500 are separated by a first separation distance 501. The word lines 112 having word line widths 510 are separated by a second separation distance 511. In preferred embodiments the summation of the bit line width 500 and the first separation distance 501 equal about twice a feature size F, and F preferably being a minimum feature size for the lithographic process used to create the word lines 112 and bit lines 114, and the summation of the word line width 510 and the second separation distance equal twice the feature size F, such that the memory cells have an area 550 equal to $4F^2$.

Figure 6:
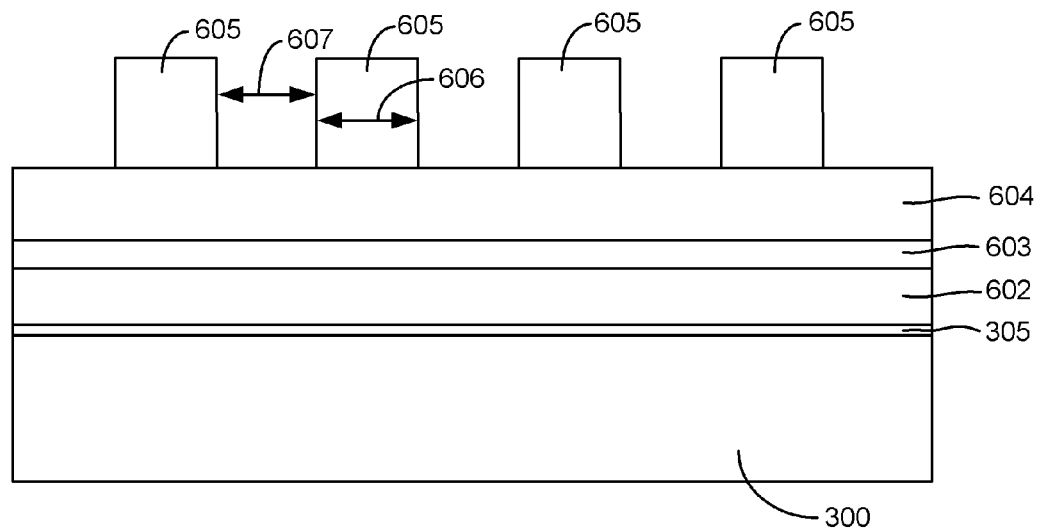
FIGS. 6 through 25 are cross sections illustrating a fabrication sequence of a memory array of self-aligned memory cells in accordance with an embodiment.

FIGS. 6-25 illustrate an embodiment of a process flow for manufacturing a memory array, utilizing a memory cell as described herein. FIG. 6 illustrates forming a gate dielectric layer 305 on a semiconductor substrate 300, forming a first conductive layer 602 on the gate dielectric layer 305, forming a second conductive layer 603 on the first conductive layer 602, forming a second dielectric layer 604 on the second conductive layer 603, and patterning a photoresist layer on the second dielectric layer 604, the photoresist layer comprising strips 605 of photoresist layer material. The strips 605 have a dimension 606 and are separated by a distance 607, each of dimension 606 and distance 607 preferably being equal to the minimum lithographic feature size F for the lithographic procedures used to create the strips 605. In an alternative embodiment the second conductive layer 603 is omitted. In some embodiments the gate dielectric layer 305 comprises silicon dioxide, the first conductive layer 602 comprises doped polysilicon, the second conductive layer 603 comprises silicide, and the second dielectric layer 604 comprises silicon nitride, or other materials which can be selectively etched relative to the gate dielectric layer 305.

Figure 7:
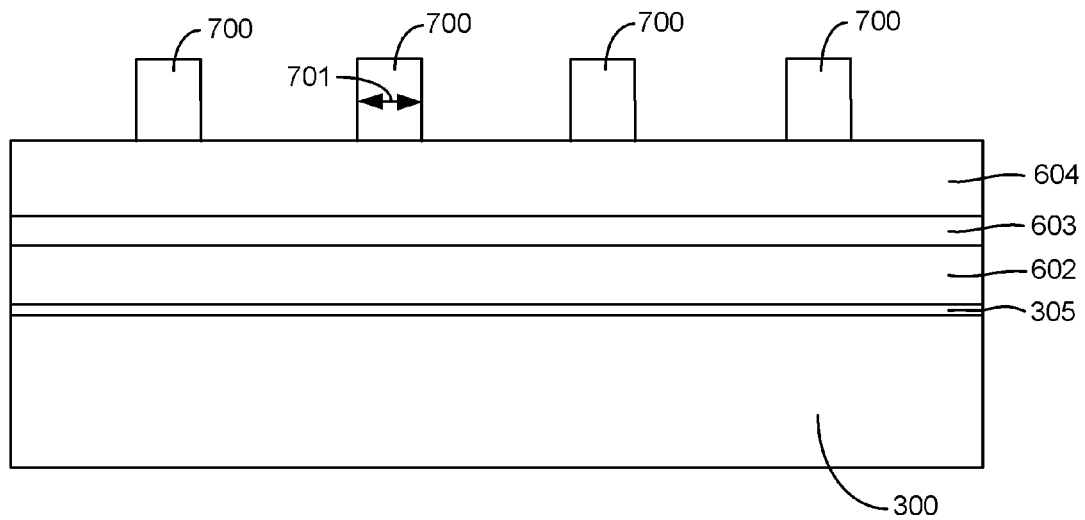

Next, the strips 605 of the structure illustrated in FIG. 6 are trimmed, resulting in the structure illustrated in FIG. 7 having strips 700. The trimming can be done, for example, by isotropic etching using an oxide plasma. The strips 700 have a dimension 701 less than dimension 606, dimension 701 being preferably less than the minimum lithographic feature size F.

Figure 8:
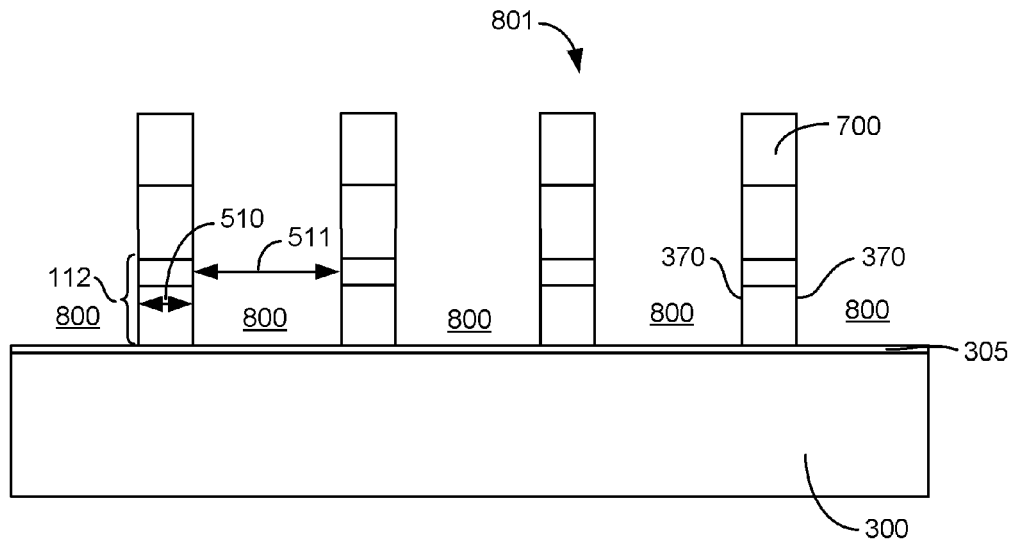

Next, etching is performed on the structure illustrated in FIG. 7, resulting in the structure illustrated in FIG. 8 having trenches 800 and word line structures 801 including word lines 112. Word lines 112 extend in parallel in a first direction into and out of the plane of the cross-section illustrated in FIG. 8. Word lines 112 in the illustrated embodiments comprise material of the first conductive layer 602 and material of the second conductive layer 603. Word lines 112 having word line width 510 and word line sidewall surfaces 370, the word lines 112 separated by a word line separation distance 511. In preferred embodiments the summation of the word line width 510 and the word line separation distance 511 equal twice the feature size F, and F preferably being the minimum feature size.

Next, dopants are implanted in the substrate below the trenches 800 and the strips 700 of photoresist material are removed from the structure illustrated in FIG. 8, resulting in the structure illustrated in FIG. 9 having word line structures 900 and doped regions 902. The doped regions 902 can be implemented by self-aligned implant processes using the word line structures 900 as masks.

Figure 9:
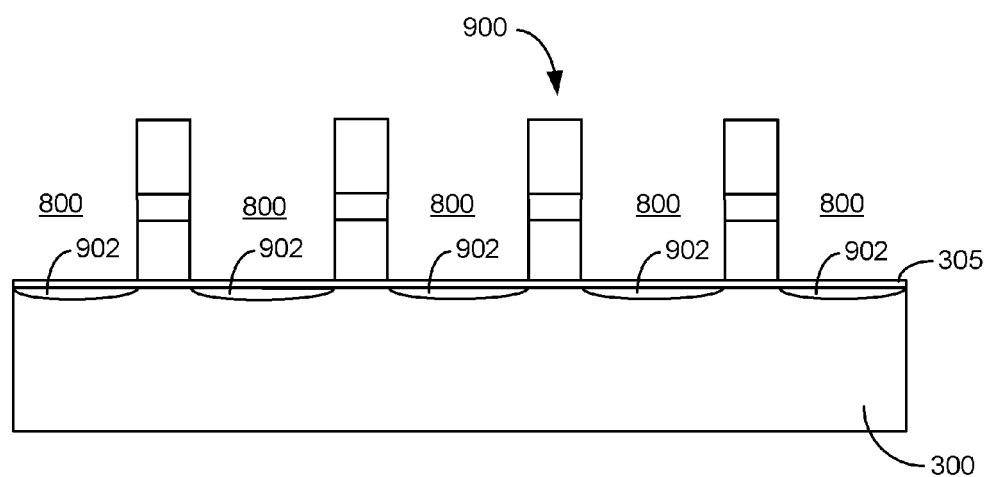
Figure 10:
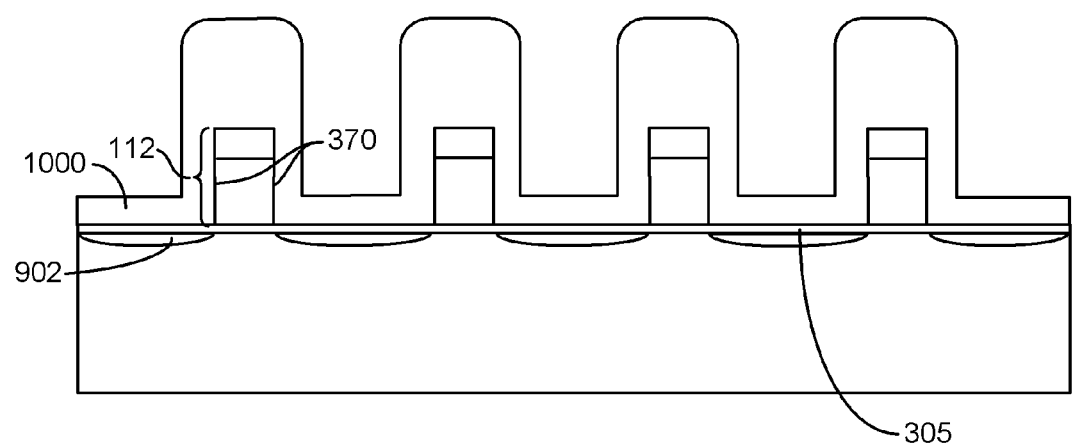
Figure 11:
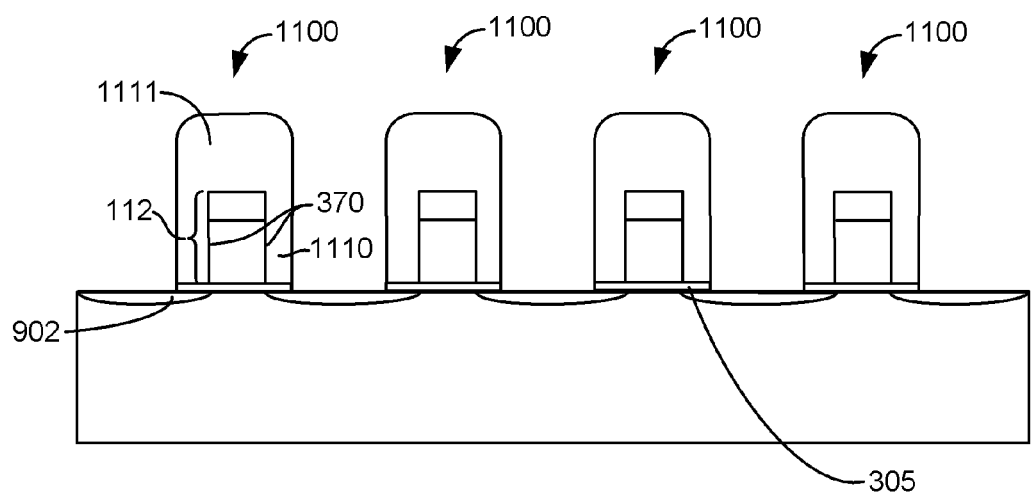

FIG. 10 illustrates forming a dielectric material layer 1000 on the structure illustrated in FIG. 9. In the illustrated embodiment the dielectric material layer 1000 comprises the same material as the second dielectric layer 604, such as silicon nitride, and can be etched selectively with respect to the layer 305. FIG. 11 illustrates the result of anisotropic etching to form sidewall spacers 1110 of dielectric material from the layer 1000 on the sidewalls 370 of the word lines 112, while leaving the cap portions 1111 of dielectric material over the tops of the word lines 112.

Figure 12:
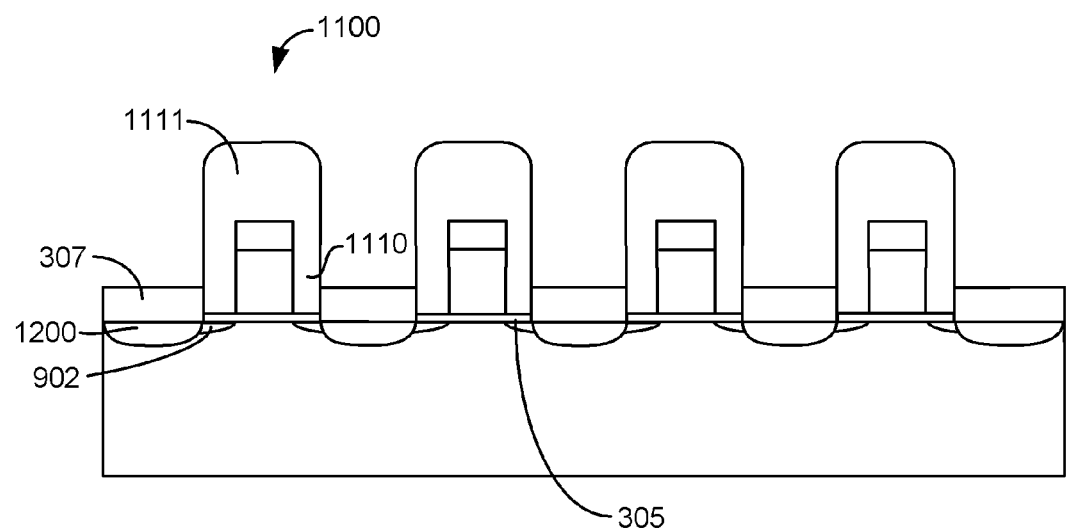

FIG. 12 illustrates forming doped regions 1200 in the substrate aligned by the sidewall spacers 1110 between the word line structures 1100 of the structure illustrated in FIG. 11, and forming the conductive layer (or the bottom electrode layer) 307, such as silicide, over each of the doped regions 1200. The formation of the doped regions 1200 can be implemented by self-aligned implant processes using the word line structures 1100 as masks. Alternatively, the formation of the doped regions 1200 can be implemented by removing the portions of the bottom electrode layer 307 not covered by the word line structures 1100 and forming doped regions 1200 on the doped regions 902 by selective epitaxy as is well known in the art. The bottom electrode layer 307 in the illustrated embodiment comprises silicide. In alternative embodiments the bottom electrode layer 307 is omitted.

Figure 13:
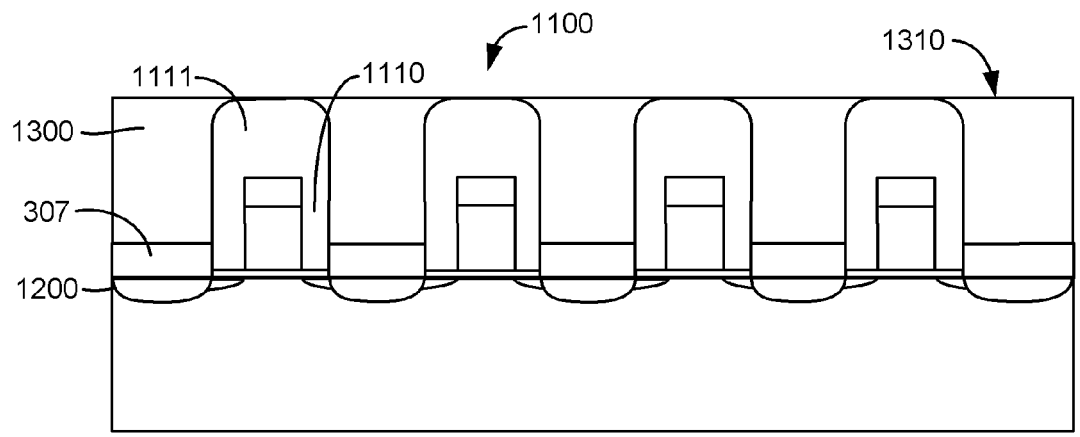

Next, a dielectric fill layer 1300 is formed on the structure illustrated in FIG. 12, by depositing a conformal layer of dielectric such as silicon dioxide, and planarizing using chemical mechanical polishing CMP or another process to expose the tops of the word line structures 1100 and provide a planar surface 1310 for subsequent processing, resulting in the structure illustrated in FIG. 13. In some embodiments the dielectric fill layer 1300 comprises silicon dioxide.

Figure 14:
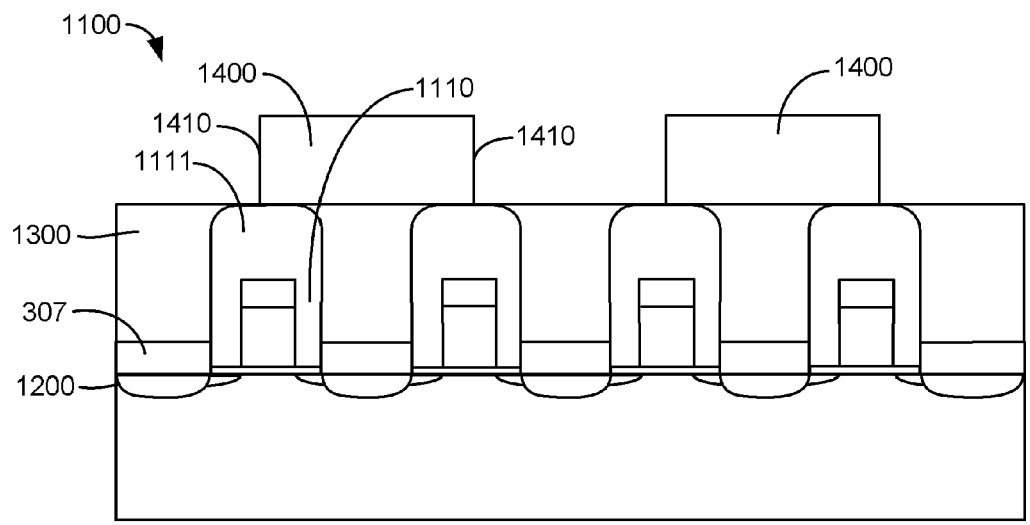

Next, strips 1400 of photoresist material are formed on the structure illustrated in FIG. 13, the strips 1400 aligned to have sides 1410 over the word line structures 1100, exposing regions between the word line structures 1100 that will include the sources of the memory cells, and masking the regions between the word line structures 1100 in which the bottom electrodes and drains of the memory cells will be formed, resulting in the structure illustrated in FIG. 14.

Figure 15:
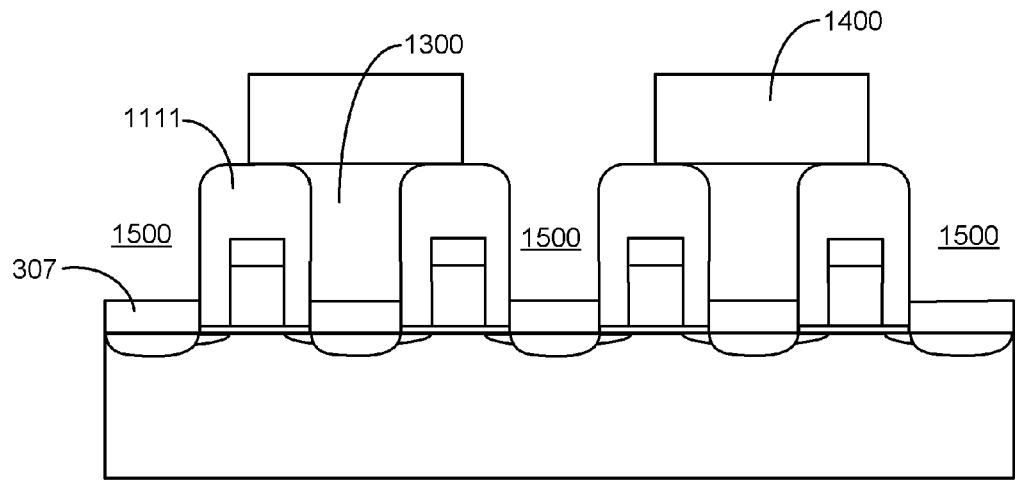

Next, the portions of the dielectric fill layer 1300 not covered by the strips 1400 are etched using the strips 1400 of photoresist and the dielectric cap portions 1111 and sidewalls 1110 as etch masks, thus forming trenches 1500 and resulting in the structure illustrated in FIG. 15, the trenches 1500 extending in parallel in the first direction.

Figure 16:
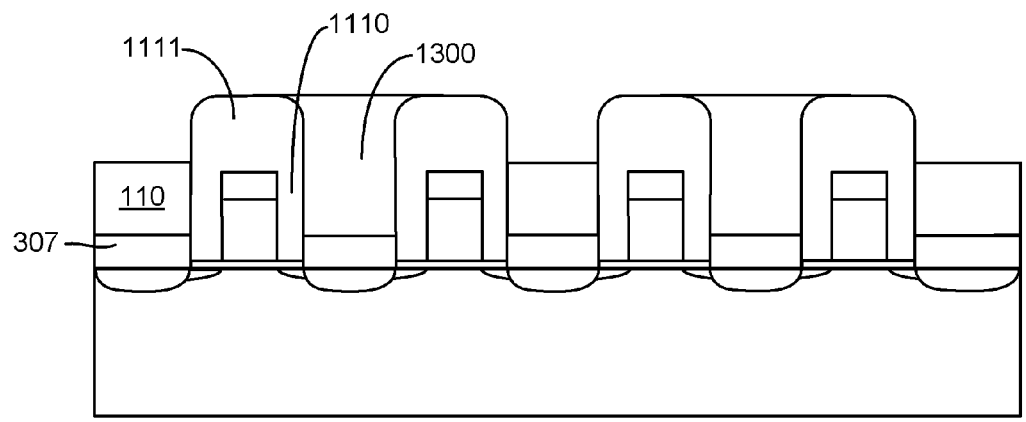

Next, conductive lines 110 comprising tungsten for example, are formed in the trenches 1500 and the strips 1400 are removed, resulting in the structure illustrated in FIG. 16. The lines 110, which are optional, can be formed, for example, by chemical vapor deposition CVD and pull back etching techniques as is well known in the art.

Figure 17:
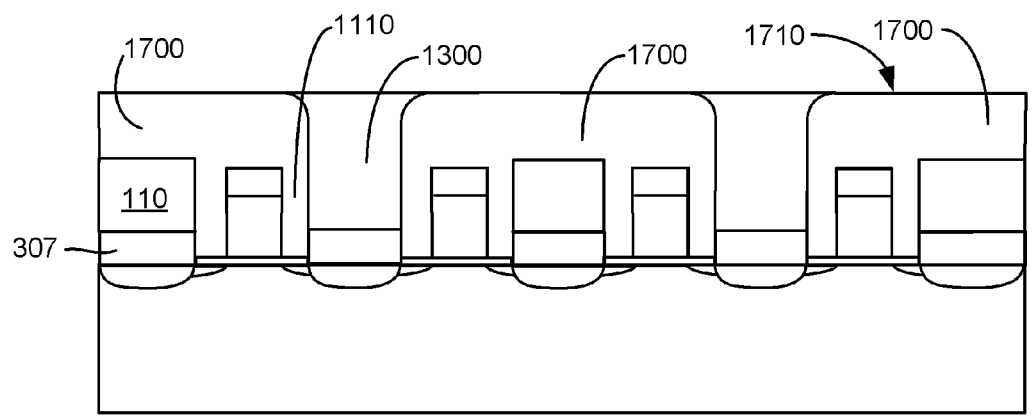

Next, a dielectric material layer is formed on the structure illustrated in FIG. 16 and planarized using CMP or another process to provide a planar surface 1710 for subsequent processing, resulting in the structure illustrated in FIG. 17 having dielectric structures 1700 on the lines 110. In the illustrated embodiment the dielectric material layer comprises the same material as the second dielectric layer 604. The dielectric material layer can be formed, for example, by atomic layer deposition ALD techniques as is well known in the art.

Figure 18:
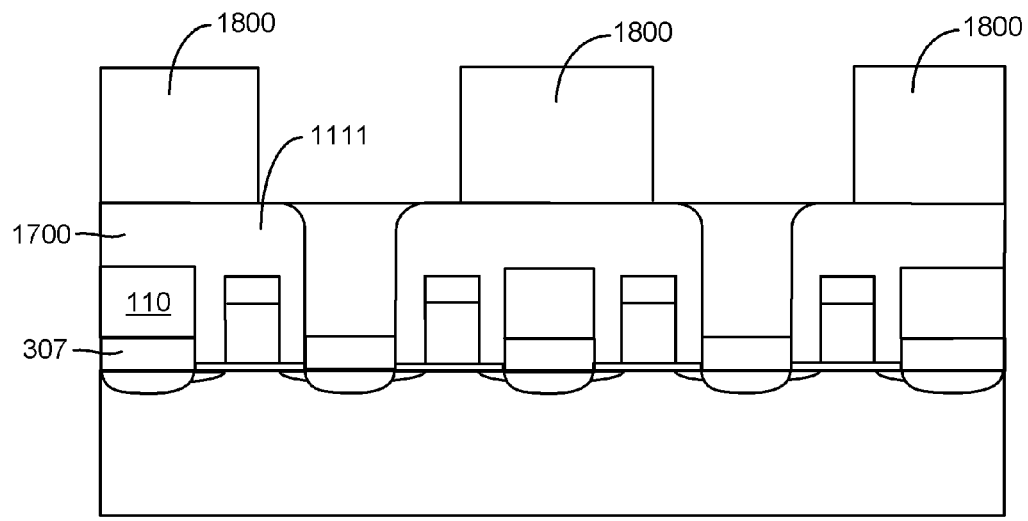

Next, strips 1800 of photoresist layer material are formed on the structure illustrated in FIG. 17, the strips 1800 masking lines 110 and the regions which will include the sources of the memory cells, and exposing the dielectric fill 1300 in the regions which will include the drains and bottom electrodes, resulting in the structure illustrated in FIG. 18. In some embodiments the step of forming the strips 1800 of photoresist is omitted.

Figure 19:
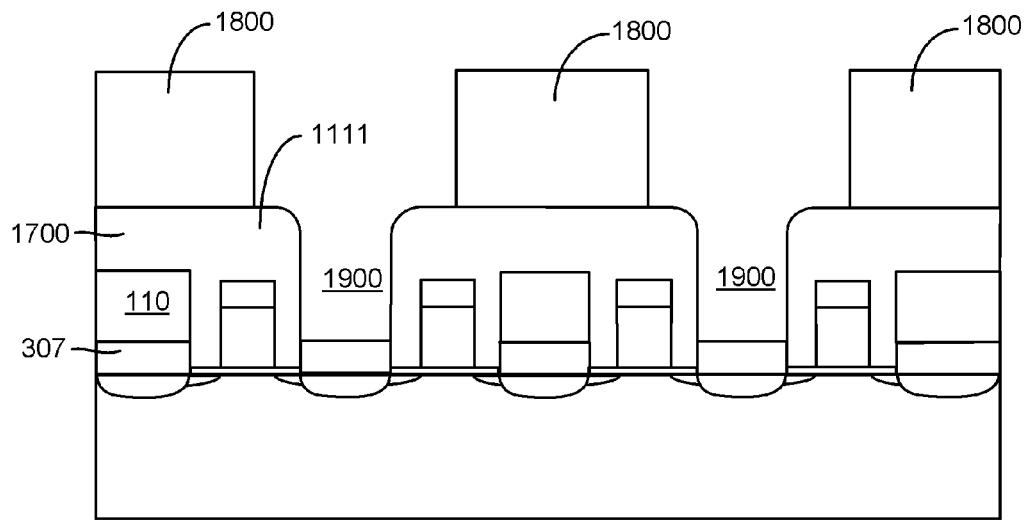

Next, trenches 1900 are formed by etching the structure illustrated in FIG. 18 using the strips 1800 of photoresist, cap portions 1111, and sidewall spacers 1110 as etch masks, the etching removing the dielectric fill 1300 down to the tops of the bottom electrode layer 307, resulting in the structure illustrated in FIG. 19.

Figure 20:
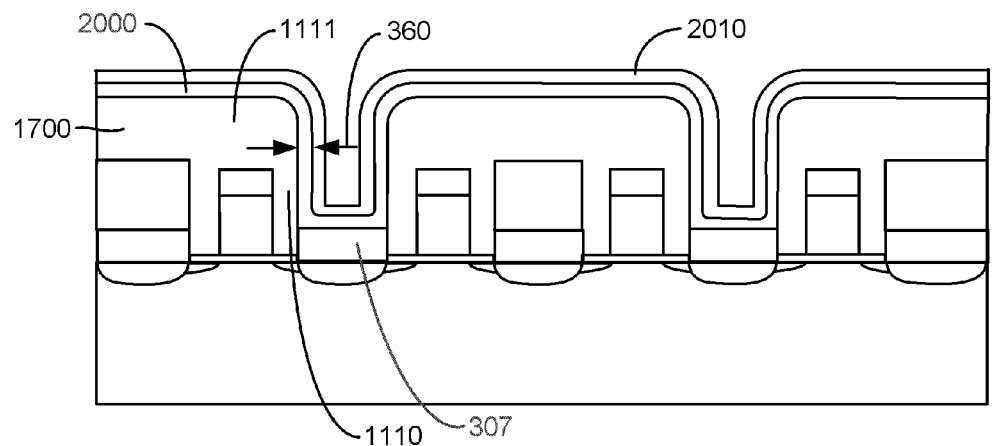

Next, the strips 1800 are removed from the structure illustrated in FIG. 19 and a conformal layer 2000 comprising a memory material having a thickness 360 is formed, followed by formation of a conformal layer 2010 comprising a dielectric liner material on the memory material layer 2000, resulting in the structure illustrated in FIG. 20. In the illustrated embodiment the dielectric liner 2010 comprises silicon dioxide. In some alternative embodiments the dielectric liner layer 2010 is omitted. The memory material layer 2000 comprises a programmable resistive material such as a phase change based material including chalcogenide based materials and other materials as described above.

Next, anisotropic etching is performed on the structure illustrated in FIG. 20 using etch chemistry that does not etch through the cap portions 1111, the dielectric structures 1700, and sidewall spacers 1110. If layer 2010 is implemented as an oxide, then fluorine-based plasma etching is typically used. If layer 2010 is implemented, for example, titanium nitride TiN, then chlorine-based plasma etching is typically used. This process results in memory member structures 2150 on the sidewall spacers 1110, memory member structures 2150 on bottom electrodes 2170, dielectric liners 2160 on the memory member structures 2150, and trenches 2100. The trenches 2100 extend into the substrate 300 an amount sufficient to electrically isolate pairs of doped regions 2120 which are between adjacent word lines 112. The trenches have dimension 2110, the dimension 2110 preferably being substantially less than the minimum lithographic feature size F. Additionally, the trenches 2100 electrically isolate the pairs of memory member structures 2150 between adjacent word lines 112.

The memory member structures 2150 comprise programmable resistive 2000 and thus the memory member structures 2150 have bottom surfaces in electrical contact with top surfaces of the bottom electrodes 2170.

Figure 21:
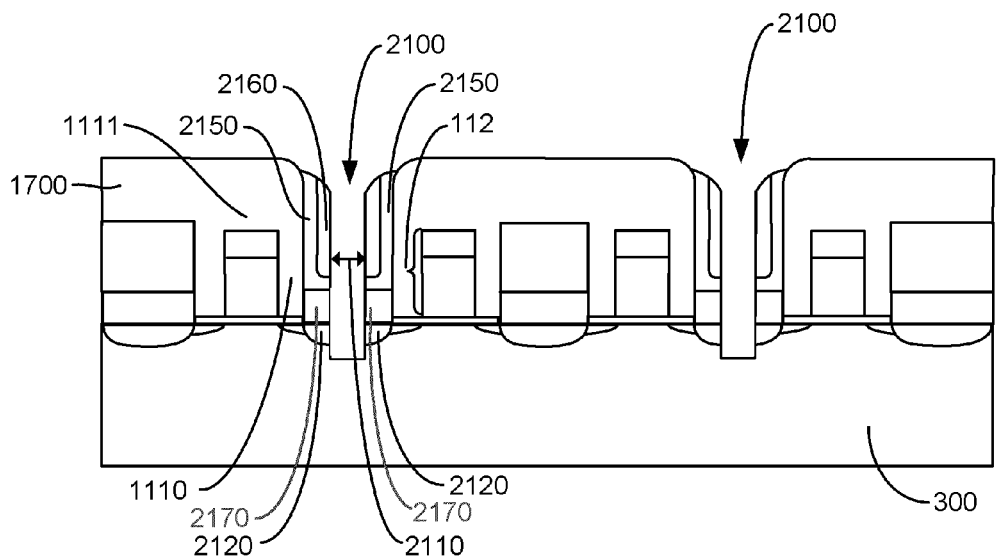
Figure 22:
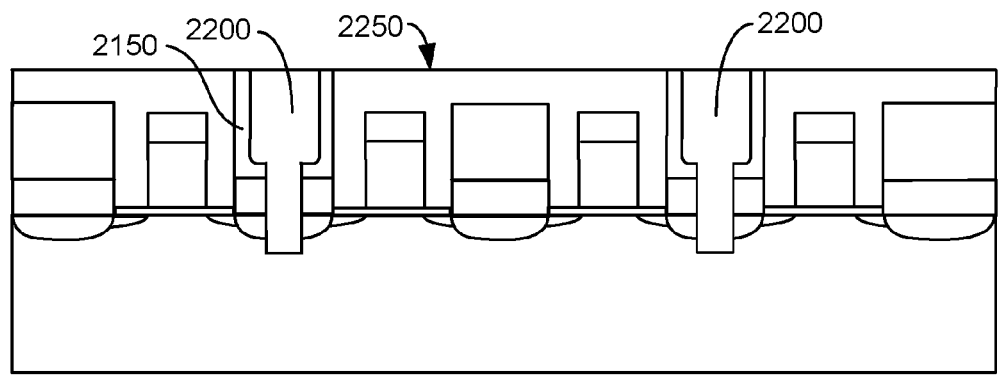

Next, the trenches 2100 of the structure illustrated in FIG. 21 are filled with a dielectric isolation structure material and planarized using CMP or another process to expose top surfaces of bottom electrode structures 2150 and provide a planar surface 2250 for subsequent processing, resulting in the structure illustrated in FIG. 22 having dielectric isolation structures 2200.

Figure 23:
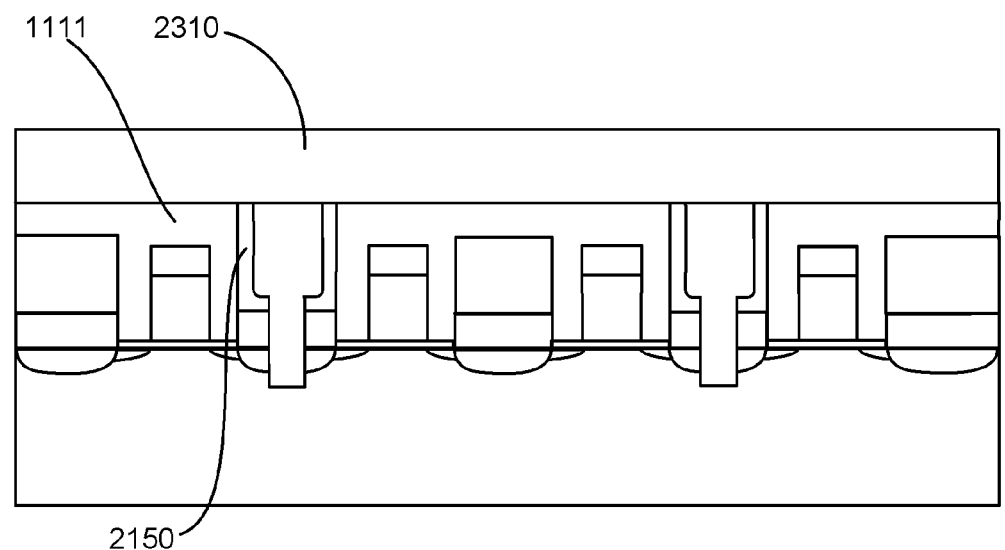

Next, a layer of bit line material 2310 is formed over top surfaces of the memory members 2150 and cap portions 1111, resulting in the structure illustrated in FIG. 23.

Figure 24:
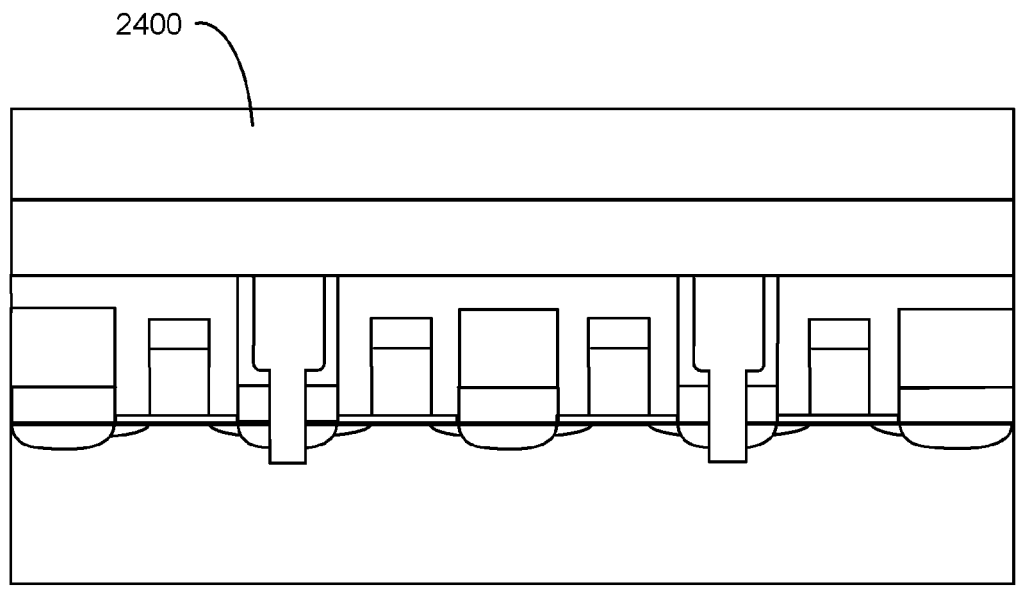
Figure 25:
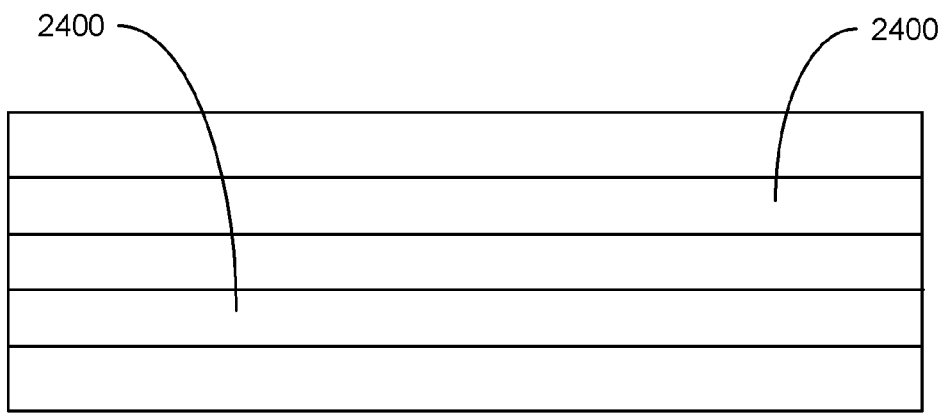

Next, strips 2400 of photoresist layer material are patterned over the structure illustrated in FIG. 23, resulting in the structure illustrated in FIGS. 24-25. FIG. 25 is a top view of the structure illustrated in FIG. 24. The strips 2400 are formed on what will be the bit lines of the array of memory cells.

Next, etching is performed on the portion of the structure illustrated in FIGS. 24-25 not covered by the strips 2400 to form trenches, the trenches then filled with dielectric material and the strips 2400 removed, resulting in the memory array illustrated in FIGS. 3-5.

An embodiment of an array of memory cells on a semiconductor substrate as described herein include a plurality of word lines on the semiconductor substrate extending in parallel in a first direction, the word lines having word line widths and respective sidewall surfaces; a sidewall dielectric layer on the sidewall surfaces; a plurality of pairs of doped regions in the substrate between adjacent word lines, wherein pairs include respective first and second doped regions; a plurality of memory members comprising a programmable resistive material with a transition region on the sidewall dielectric layers, first and second memory members in the plurality of memory members between adjacent word lines having bottom surfaces in electrical contact with the respective first and second doped regions; a plurality of top electrode structures positioned over and in electrical contact with memory members in the plurality of memory members, the top electrode structures having sides extending in parallel in a second direction perpendicular to the first direction, the memory members in the plurality of memory members having sides aligned with the sides of the corresponding top electrode structures; and a plurality of dielectric isolation structures wherein the dielectric isolation structures isolate respective pairs of the first and second doped regions between adjacent word lines.

Advantages of an embodiment described herein include self-aligned memory cells having reduced cells sizes, providing an array architecture supporting high-density devices, and a method for manufacturing such structure that meets tight process variation specifications needed for large-scale memory devices.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

I claim:

1. A memory cell on a semiconductor substrate, comprising
two bottom electrodes on the semiconductor substrate;
an isolation structure extending into the semiconductor substrate and isolating the two bottom electrodes;
a top electrode;
a first memory element having a first bottom surface aligned with one of the two bottom electrodes, and having a first top surface in electric contact with the top electrode; and
a second memory element having a second bottom surface aligned with the other of the two bottom electrodes, and having a second top surface in electric contact with the top electrode;
wherein the first and second bottom surfaces are wider than the first and second top surfaces.

2. The memory cell of claim 1, wherein the first and second memory elements comprise a programmable resistive material with an active region within the memory element.

3. The memory cell of claim 1, further comprising first and second word lines on the semiconductor substrate extending in parallel in a first direction, the first word line having a word line width and a principal sidewall surface, the second word line having a word line width and a principal sidewall surface.

4. The memory cell of claim 3, further comprising first and second sidewall dielectric members, the first sidewall dielectric member formed on the principal sidewall surface of the first word line, the second sidewall dielectric member formed on the principal sidewall surface of the second word line.

5. The memory cell of claim 1, wherein the top electrode further comprises sides extending in parallel in a second direction perpendicular to the first direction, and the first and second memory elements having sides aligned with the sides of the top electrode structure.

6. The memory cell of claim 1, wherein the first and second memory elements have a thickness of about 20 nm or less.

7. The memory cell of claim 1, wherein the first and second memory elements have a thickness ranging from about 2 nm to about 50 nm.

8. The memory cell of claim 1, further comprising first and second doped regions beneath the two bottom electrodes and isolated by the isolation structure.

* * * * *